United States Patent
Jayaraman

(10) Patent No.: US 6,630,899 B2
(45) Date of Patent: *Oct. 7, 2003

(54) SCHEME FOR MAXIMIZING EFFICIENCY OF POWER AMPLIFIER UNDER POWER BACKOFF CONDITIONS

(75) Inventor: Arun Jayaraman, San Jose, CA (US)

(73) Assignee: Tripath Technology, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/908,879

(22) Filed: Jul. 18, 2001

(65) Prior Publication Data

US 2002/0102971 A1 Aug. 1, 2002

Related U.S. Application Data

(60) Provisional application No. 60/219,954, filed on Jul. 20, 2000.

(51) Int. Cl.⁷ ............................................. H03M 1/12
(52) U.S. Cl. ........................................ 341/200; 330/151
(58) Field of Search ........................ 341/200; 330/151, 330/149, 52

(56) References Cited

U.S. PATENT DOCUMENTS

| | | | |
|---|---|---|---|
| 5,521,549 A | 5/1996 | Nelson | 330/10 |
| 6,246,283 B1 | 6/2001 | Ahuja et al. | 330/109 |
| 6,392,483 B2 * | 5/2002 | Suzuki | 330/151 |

* cited by examiner

Primary Examiner—Brian Young
(74) Attorney, Agent, or Firm—Beyer Weaver & Thomas, LLP

(57) ABSTRACT

A bandpass amplifier for use in a communication system is described. The amplifier includes a filter, a quantizer, a driver, and a feedback loop. The filter filters the input signal, thereby generating a filtered signal. The quantizer quantizes the filtered signal into one of two values, thereby generating a quantized signal. The driver amplifies the quantized signal, thereby generating the output signal. The feedback loop feeds the output signal to the filter. The quantizer has characteristics in which the quantized signal does not fluctuate between the two values when the input signal is substantially stable.

15 Claims, 8 Drawing Sheets

SCHEME FOR MAXIMIZING EFFICIENCY OF POWER AMPLIFIER UNDER POWER BACKOFF CONDITIONS

RELATED APPLICATION DATA

The present application claims priority from U.S. Provisional Patent Application No. 60/219,954 for SCHEME FOR MAXIMIZING EFFICIENCY OF CLASS-T POWER AMPLIFIER UNDER POWER BACKOFF CONDITIONS filed on Jul. 20, 2000 (Attorney Docket No. TRIPP032P), the entire disclosures of which are incorporated herein by reference for all purposes.

BACKGROUND OF THE INVENTION

The present invention relates to RF (radio frequency) communication systems, and more specifically, to apparatus and methods for maximizing efficiency of power amplifiers under power backoff conditions.

Wireless communication, such as cell phones for voice and data, has become extremely popular. Currently, several wireless schemes are in use, including GSM (Group Special Mobile), TDMA (Time Division Multiple Access), and CDMA (Code Division Multiple Access). Of these, CDMA appears to be emerging as the standard in the U.S., European and Asian markets. CDMA often requires RF transmissions using both phase and amplitude modulation. The efficiency and power consumption of the power linear amplifiers used to generate an RF signal in either a CDMA cell phone or base station are therefore extremely important.

Use of low efficiency linear amplifiers is detrimental for several reasons. Such amplifiers tend to burn a significant amount of energy which is problematic, particularly in a battery operated cell phone. Power consumption is also problematic in base stations. The heat caused by many low efficiency amplifiers in a base station can cause components to fail, thus reducing reliability. The linearity of the power amplifier is also important. In a base stations where the transmission of multiple signals occurs simultaneously, amplifiers characterized by poor linearity may cause the inadvertent mixing of these signals.

A number of types of amplifier classes can be used in RF communication systems, including Class A, Class AB, Class C, Class E, Class F, and Class D (sometimes referred to as digital amplifiers). Each of these types of amplifiers, however, have significant problems when operating in the RF range. For example, Class A and Class AB amplifiers have very poor efficiency but reasonable linearity. Class C amplifiers are reasonably efficient but are only practical for phase modulation. Similarly Class E, F, and D amplifiers are typically only useful for phase modulation applications. Class E amplifiers have improved power efficiency when compared to C type amplifiers, but large voltage swings at their output limit their usefulness. Class F amplifiers exhibit relatively efficient switching characteristics with a repeating input signal. But with a non-repeating input signal, such as those normally encountered in a cellular phone or base station, the problems caused by harmonics become overwhelming.

Conventional class D amplifiers have linear operating characteristics and are generally highly efficient at lower frequencies but have heretofore been subject to several drawbacks at higher frequencies. Most notably, at higher frequencies such as RF they exhibit switching problems at their output transistors. As these transistors switch on and off rapidly, switching transients including high levels of current and voltage are developed at the output, causing overshoot and undershoot.

Another problem with conventional class D amplifiers when used in communication systems where RF signals are both transmitted and received is the "leakage" of energy from the transmit band into the receive band. This may occur if the duplexor or T/R switch at the antenna does not completely isolate the signals received at the communication device from the transmit circuitry within the device.

Most cellular systems today use FDD (Frequency Division Duplexing) to achieve simultaneous transmit and receive capability. This is accomplished by using separate frequency bands for transmitting and receiving. For example, IS-95 CDMA systems in the United States uses 824–849 MHz for transmitting from a mobile station (i.e., upstream transmission) and 869–894 MHz for receiving at the mobile station (i.e., downstream transmission). FDD systems require limits on transmit emissions in the receive band to avoid corresponding degradation of the sensitivity of their own and neighboring mobile receivers. Systems which employ time division duplexing (TDD) also require limits on transmit emissions in the receive band, but typically to a lesser extent.

Generally, conventional switching-mode power amplifiers operate by toggling between two states, namely VCC (+V) and GND (0V) levels. A switching device turns on and off at the switching frequency fsw. A switching device, such as an FET (Field Effect Transistor), includes parasitic capacitance C, and charges and discharges this parasitic capacitance C when it turns on and off at the switching frequency fsw. As a result, a switching device causes switching loss Ploss due to the parasitic capacitance C, which is expressed as:

$$P_{loss} = f_{sw} \cdot C \cdot V^2$$

Therefore, the switching frequency fsw is important since it directly affects the switching loss Ploss due to the parasitic capacitance C.

Conventional switching amplifiers which keep the switching frequency fsw constant, and change phase only. In such a case, the switching frequency fsw is approximately equal to a radio carrier frequency fc. The switching frequency fsw is independent of the modulating signal amplitude or power delivered to the load. To maintain maximum efficiency under power backoff conditions, the power supply needs to be reduced as a function of output power required. However, in conventional switching amplifiers, the switching frequency fsw is an average frequency, which is dependent on loop parameters and choice of quantizer sampling frequency fs in addition to the radio carrier frequency fc. Thus, the value of fsw is relatively independent of the power output since the amplitude information can be carried by the switching waveform itself. This results in reduction of PAE (Power-Added Efficiency) of the amplifier when the output power is backed off from maximum.

In view of the foregoing, amplifiers and methods capable of maximizing PAE even when the output power is backed off are needed.

SUMMARY OF THE INVENTION

According to a specific embodiment of the present invention, an amplifying device for generating an output signal is disclosed. In one embodiment, the amplifying device includes a filter which filters the input signal, thereby generating a filtered signal; a quantizer which quantizes the filtered signal into one of two values, thereby generating a quantized signal; a driver which amplifies the quantized signal, thereby generating the output signal; and a feedback loop which feeds the output signal to the filter. In this embodiment, the quantizer has characteristics in which the quantized signal does not fluctuate between the two values when the input signal is substantially stable.

In a further specific embodiment of the amplifying device, the quantizer has an input offset. In another further specific embodiment of the device, the quantizer has a hysteresis characteristic.

According to another specific embodiment of the present invention, a method for amplifying an input signal to generate output signal includes filtering the input signal, thereby generating a filtered signal; quantizing the filtered signal into one of two values, thereby generating a quantized signal; amplifying the quantized signal, thereby generating the output signal; and feeding the output signal to the filter. In the method for amplifying, the quantized signal does not fluctuate between the two values when the input signal is substantially stable.

In a further specific embodiment of the amplifying method, the quantizer has an input offset. In another further specific embodiment of the amplifying method, the quantizer has a hysteresis characteristic.

The above embodiments of the present invention are advantageous when it is desirable to reduce the switching frequency fsw as a direct function of the reduced output power instead of varying power supply to backoff power.

A further understanding of the nature and advantages of the present invention may be realized by reference to the remaining portions of the specification and the drawings.

DETAILED DESCRIPTION OF SPECIFIC EMBODIMENTS

Various embodiments of the present invention will now be described in detail with reference to the drawings, wherein like elements are referred to with like reference labels throughout.

Figure 1:
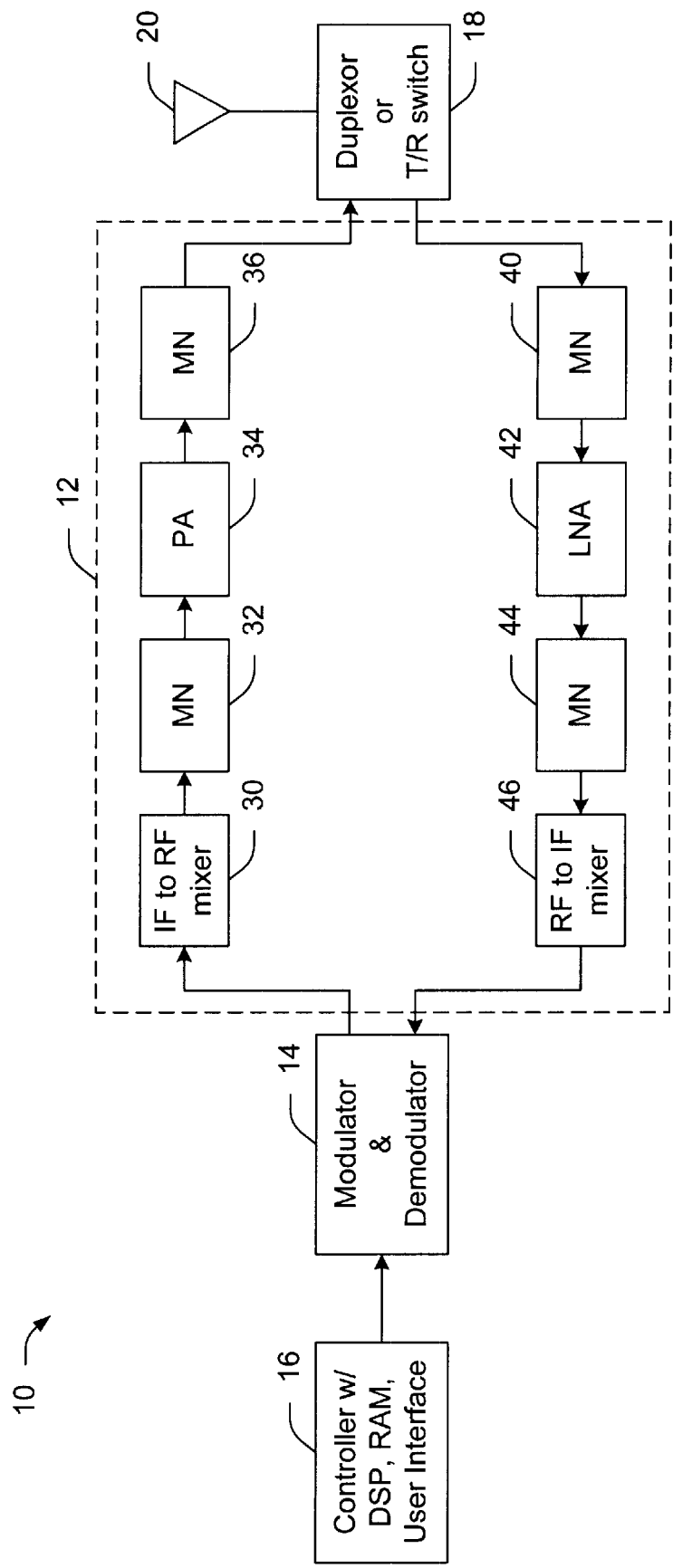
FIG. 1 is a block diagram of a cell phone used for a specific embodiment of the present invention.

Referring to FIG. 1, a simplified block diagram of a cell phone 10 designed according to the present invention is shown. Cell phone 10 includes an RF block 12, a modulation and demodulation block 14, a controller block 16 including DSP, RAM, user interface, baseband circuitry configured to generate a baseband signal, and other standard circuitry used in a cell phone, a duplexor or a T/R (transmit/receive) switch 18 (a duplexor is used for cell phones that transmit and receive at the same time, and a T/R switch is used for cell phones that either transmit or receive alternately), and an antenna 20. For the sake of simplicity, the block 18 is collectively referred to as the "duplexor" in the specification.

During transmission, the baseband circuitry in controller 16 is responsible for generating a baseband signal, which is typically a string of bits representative of the information to be transmitted. The baseband signal is then modulated in box 14 with an intermediate frequency (IF) modulation signal which is then provided to RF block 12. Since the functionality of the modulation and demodulation block 14, the controller 16, the duplexor 18 and the antenna 20 are all well known in the art, a detailed description of each is not provided herein.

The RF block 12 includes an IF to RF mixer 30 for generating an RF signal (e.g., 825 MHz) from the modulated signal received from the controller 16 through the modulator 14, a matching network (MN) 32, a power amplifier (PA) 34 configured to amplify the RF signal, and another matching network (MN) 36. During transmission, the amplifier 34 amplifies the RF signal and provides it to the antenna 20 via the matching network 36 and the duplexor 18. On the receive side, RF block 12 includes a matching network 40 configured to receive an RF signal (e.g., 870 MHz) received by antenna 20, a low noise amplifier (LNA) 42, another matching network 44, an RF to IF mixer 46 which mixes down the RF signal to the IF range and then provides it to the demodulator in block 14. Demodulator 14 demodulates the transmitted baseband information and provides it to controller 16. Since mixer circuits 30 and 46, LNA 42, and matching networks 32, 40 and 44 are all well known, they are not described in detail herein.

Figure 2:
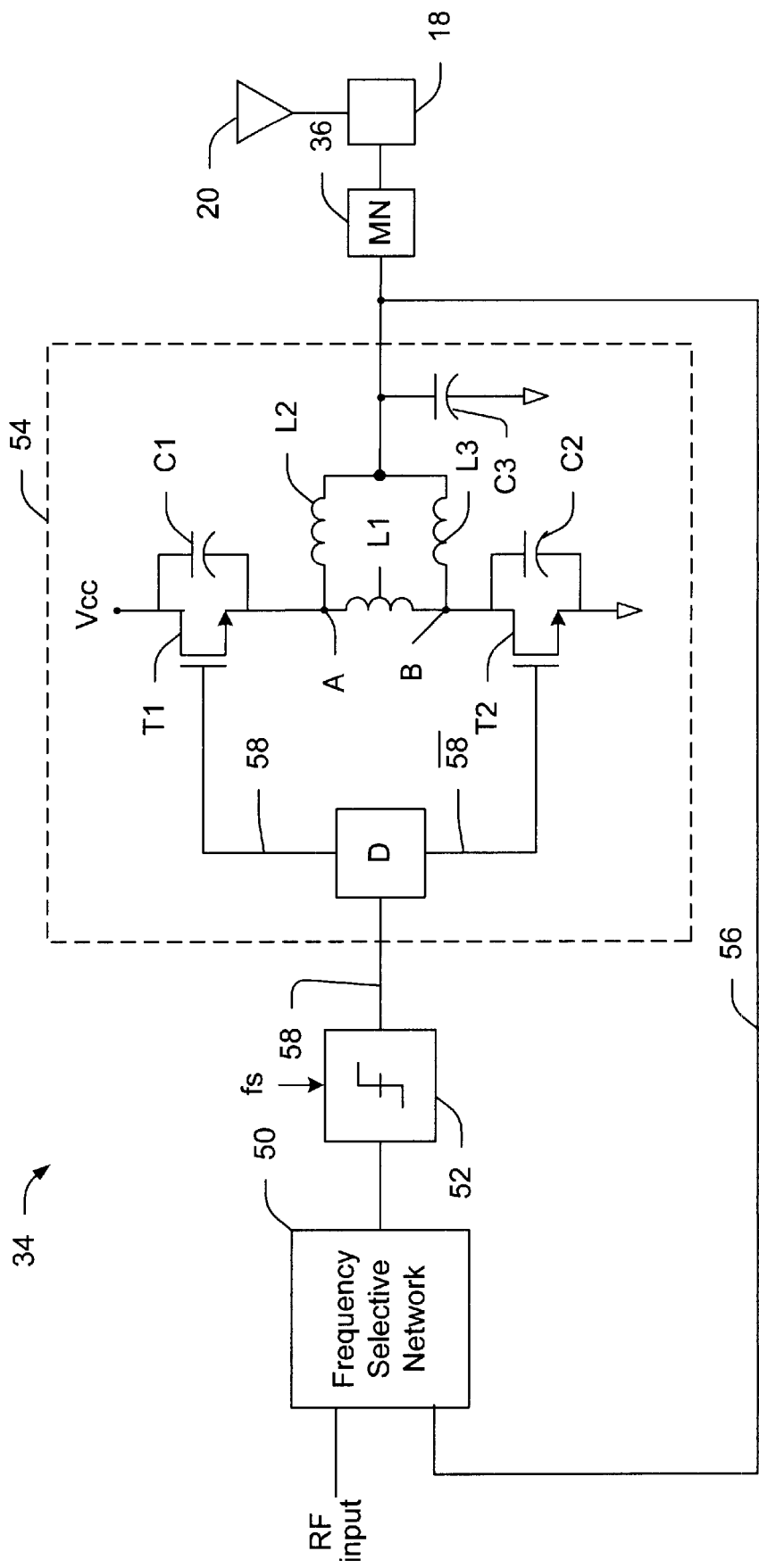
FIG. 2 is a circuit diagram of the digital linear RF amplifier of FIG. 1 in accordance with one embodiment of the present invention.

Referring to FIG. 2, a circuit diagram of the digital RF power amplifier 34 of FIG. 1 designed according to a specific embodiment of the present invention is shown. According to various specific embodiments, amplifier 34 may be designed based on the techniques described in U.S. Pat. No. 5,777,512 for METHOD AND APPARATUS FOR OVERSAMPLED, NOISE-SHAPING, MIXED-SIGNAL PROCESSING issued on Jul. 7, 1998, and a copending patent application Ser. No. 09/908,967 (Attorney Docket No. TRIPP033), for RECEIVE BAND REJECTION FOR A DIGITAL RF AMPLIFIER, filed on Jul. 18, 2001, assigned to the same assignee hereof, the entire disclosure of which is incorporated herein by reference for all purposes.

Amplifier 34 includes a frequency selective network 50 with a high Q at the desired transmission frequency, an analog-to-digital converter (A/D) 52, an output stage 54, and a feedback loop 56 which provides a continuous-time feedback signal from the output stage 54 to the frequency selective network 50. The A/D converter 52 samples the output of the frequency selective network 50 and generates a digital signal at 58 which is provided to the output stage 54. In one embodiment, the A/D converter 52 is a comparator that samples at a frequency (fs) of 3.6 GHz for applications where a transmit band of 900 MHz is desired. In an alternate embodiment, the sampling frequency (fs) can range from a minimum of 1.8 GHz to 3.6 GHz or higher for the transmission of a 900 MHz signal. In general, the sampling frequency (fs) should be at a minimum approximately 2× and preferably at least 4× the desired transmission frequency.

One possible implementation of the output stage 54 includes two transistors T1 and T2, inductors L1, L2, and L3, capacitors C1, C2 and C3, and a pre-driver D. The pre-driver D is configured to buffer signal 58 and to provide signal 58 and its complement to the gates of the transistor T1 and the transistor T2, respectively. The drain of the transistor T1 is coupled to Vcc and the source is coupled to a node A. The capacitor C1 is typically the parasitic capacitor between the source and drain of the transistor T1. The drain of the transistor T2 is coupled to a node B and the source is coupled to ground. The capacitor C2 is typically the parasitic capacitor between the source and drain of the transistor T2. The inductor L1 is coupled between the node A and the node B, and the inductors L2 and L3 are coupled between the capacitor C3 and the nodes A and B, respectively.

During operation, the digital signal 58 generated by the A/D converter 52 transitions between high and low levels based on the information being transmitted. Since the signal 58 and its complement are provided to the gates of the transistors T1 and T2 respectively, one transistor is on and the other is off depending on the state of the signal 58. When the signal 58 transitions low level, for example, T1 turns off and T2 turns on. When this occurs, node A resonates due to the formation of a resonating circuit within the output stage 54. This resonating circuit is formed by C1, the three inductors L1, L2, and L3, and node B which is pulled to ground through T2. Driver circuit 54 thus in effect contains two separate resonators at nodes A and B. Depending on the state of signal 58, one node resonates while the other is clamped. In one embodiment, the resonators are tuned to resonate at the sampling frequency of 3.6 GHz. This is accomplished by selecting the values of inductors L1, L2, and L3 and capacitors C1, C2 and C3. According to a specific embodiment, C3 is selected to bypass an undesired frequency component output from the output stage 54.

The output of the switching stage 54 is provided to the matching network 36 which acts as a bandpass filter operating at the transmit band (e.g., 824–849 MHz). Since the antenna 20 transmits at the 900 MHz band in the above-described embodiment, the "tracking" function of the matching network 36 needs to match this frequency. In one embodiment, this is accomplished by selecting the values of L1, L2, and L3, and C3 so that the resonance circuit has a transfer function looking into matching network 36 of approximately 900 MHz so that the output bit pattern generated by T1 and T2 has an energy component at the transmit band. In other words, the matching network 36 has to provide a signal pass rate sufficient to make sure that the bit pattern has sufficient energy at the transmit band for the impedance of the antenna 20 (which is typically 50 ohms).

In another embodiment, the matching network 36 uses the bond wires on the chip containing the power amplifier 34 and other passive components, to create a matching network to provide optimal power transfer to the antenna 20 and to transform the impedance of the antenna 20 to an impedance where the desired power level can be achieved from a given supply voltage. Accordingly, a relatively high Q filter that has a relatively narrow band is preferably implemented. In yet another embodiment, the power amplifier 34 is designed to have a bridged output. In applications where the antenna 20 has a single ended output, a BALUN (balance-to-unbalance) transformer or a passive LC combiner may be used.

One potential problem with the power amplifier 34 when used in a cell phone application relates to the fact that the transmitted power includes switching energy in the receive band which has the potential to desensitize the associated or any nearby receivers. Thus, for both FDD and TDD applications, there are limits relating to the maximum allowable transmit energy in the receive band. Various embodiments of the present invention provide solutions for addressing this problem, and have advantages especially for the FDD applications to meet the receive band noise requirements associated with the FDD system.

Figure 3:
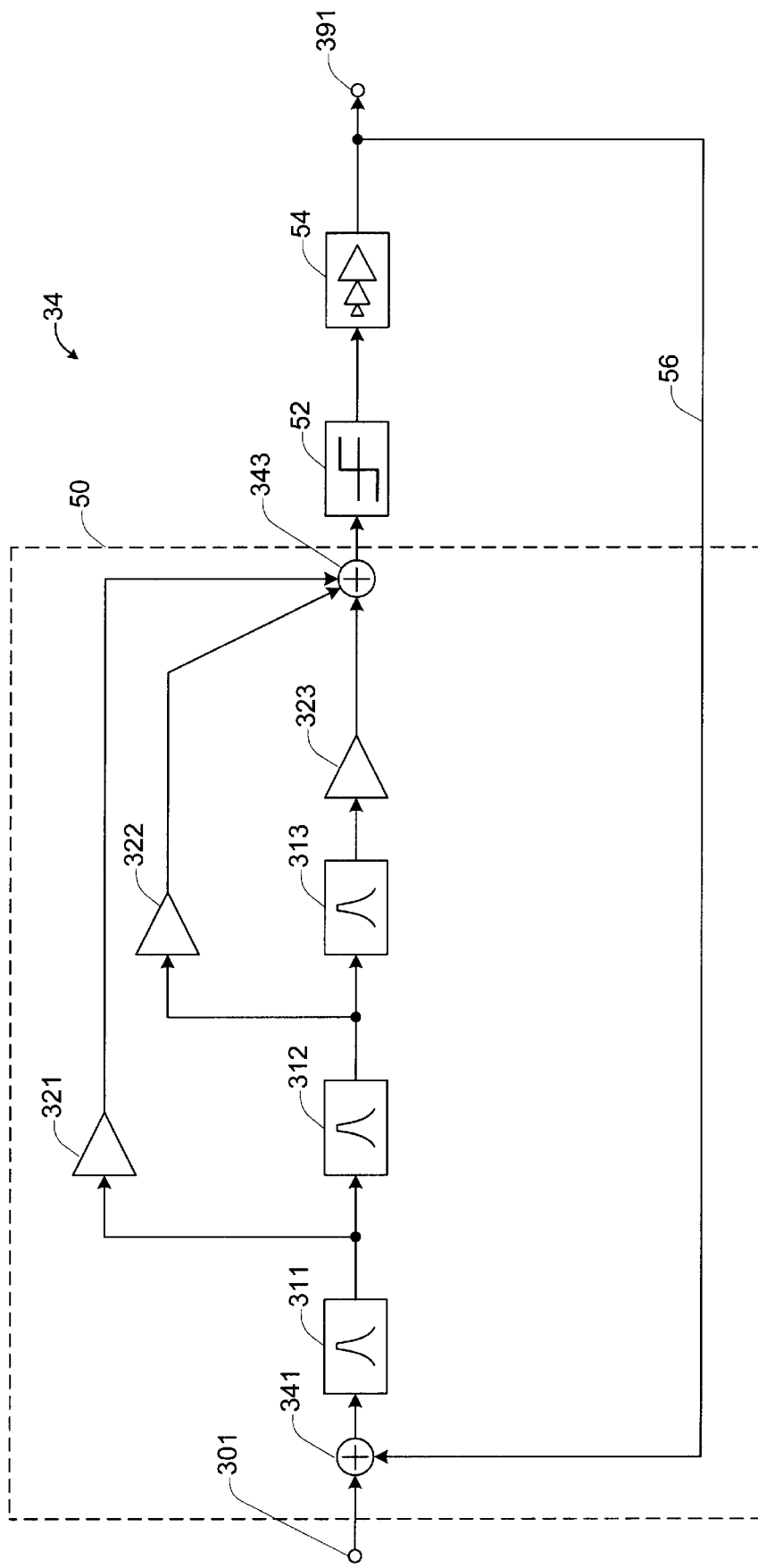
FIG. 3 is a block diagram of the amplifier of FIG. 2 with an expanded view in accordance with a first embodiment of the present invention.

Referring to FIG. 3, a specific embodiment of the power amplifier 34 of FIG. 1 according to the present invention will be now described. The power amplifier 34 includes the frequency selective network 50, the A/D converter 52, the output stage 54, and the feedback loop 56. Since the functionality of the A/D converter 52, the output stage 54, and the feedback loop 56 is similar to those described referring to FIGS. 1 and 2, a detailed description of each is not provided here. In this specification, a more general term, a "quantizer" covers the A/D converter 52 and other circuitry operable to quantize an input signal into one of two values, thereby generating a quantized signal.

The frequency selective network 50 includes bandpass resonators 311–313 having fixed parameters, such as a resonant frequency and a Q factor. The term "resonator" referred in this specification covers a filter resonating at a frequency or combination of a plurality of such filters. The resonators 311–313 have a center frequency equal to the center of transmit band (e.g., 836 MHz for the U.S. IS-95 standard). Multipliers 321–323 multiply signals output from the resonators 311–313 by coefficients k1–k3, respectively. Adders 341 and 343 sum up input signals and output the resulting signal.

The stability of the power amplifier 34 having the feedback loop 56 is dependent on the input signal power at a node 301 as well as the order of the frequency selective network 50 and coefficient elements 321 and 322. Generally, as the order of the frequency selective network 50 increases, the maximum input signal at which the feedback loop 56 is stable decreases. As the order of the frequency selective network 50 increases, a quantization noise floor of the power amplifier 34 decreases. This specific embodiment of the present invention utilizes an adaptive increase in the order of the frequency selective network 50 as an inverse function of the output power required at a node 391.

In this specification, the "order of a filter" is determined by a number of bandpass filters whose transfer function is expressed in the form of $1/(s^2+\omega_0^2)$, where $\omega_0$ represents an angular resonant frequency of the filter. Thus, a "first-order filter" is a bandpass filter whose transfer is expressed in the form of $1/(s^2+\omega_0^2)$, where $\omega_0$ represents an angular resonant frequency of the filter. A "second-order filter" is a filter which is equivalent to two first-order filters coupled in series. However, it should be understood that the second-order filter may be implemented in various ways other than connecting two first-order filters serially. Similarly, a "third-order filter" is a filter which is equivalent to three first-order filters coupled in series. However, it should be understood that the third-order filter may be implemented in various ways other than connecting three first-order filters serially.

The coefficients k1–k3 of the multipliers 321–323 are adaptively set to values based on normalized power output Pn, where Pn=P–Pmax (P: power output, Pmax: maximum power output) as follows:

TABLE 1

| Pn(dB) | k1 | k2 | k3 |
|---|---|---|---|
| 0 to −10 | 4.0 | 0.5 | 0.01 |
| −10 to −20 | 4.0 | 3.0 | 0.01 |
| −20 to −40 | 4.0 | 2.0 | 1.0 |

However, it should be understood that Table 1 above shows a possible specific set of coefficients k1–k3 used for an embodiment of the present invention, and may be modified based on specific requirements for the power amplifier 34.

Suppose the coefficients k1–k3 are generally expressed as follows:

TABLE 2

| Pn (dB) | k1 | k2 | k3 |
|---|---|---|---|
| Range 1 | k11 | k21 | k31 |
| Range 2 | k12 | k22 | k32 |
| Range 3 | k13 | k23 | k33 |

(Range 1 > Range 2 > Range 3)

For example, the coefficients k1–k3 may be values satisfying the following expressions:

$$k22/k12 > k21/k11 \quad (1),$$

and $$k33/k13 > k32/k12 \quad (2).$$

The expression 1 means that the first-order filter (i.e., the resonator 311) is relatively dominant in the high output level (i.e., Range 1), and the second-order filter (i.e., the resonators 311 and 312 coupled in series) is relatively dominant in the mid output level (i.e., Range 2). Similarly, the expression 2 means that the second-order filter (i.e., the resonators 311 and 312 coupled in series) is relatively dominant in the mid output level (i.e., Range 2), and the third-order filter (i.e., the resonators 311–313 coupled in series) is dominant in the low output level (i.e., Range 3).

According to another specific embodiment, the coefficients k1–k3 of the multipliers 321–323 may be adaptively set to values each having a range based on normalized power output Pn, where Pn=P–Pmax (P: power output, Pmax: maximum power output) as follows:

TABLE 3

| Pn (dB)    | k2/k1   | k3/k1       |
|------------|---------|-------------|
| 0 to –10   | 0.1–0.5 | —           |
| –10 to –20 | 0.5–1.0 | 0.001–0.1   |
| –20 to –40 | —       | 0.1–0.5     |

However, it should be understood that Table 1 above shows a possible specific set of coefficients k1–k3 used for a particular embodiment of the present invention, and may be modified based on specific requirements for the power amplifier 34.

Figure 4:
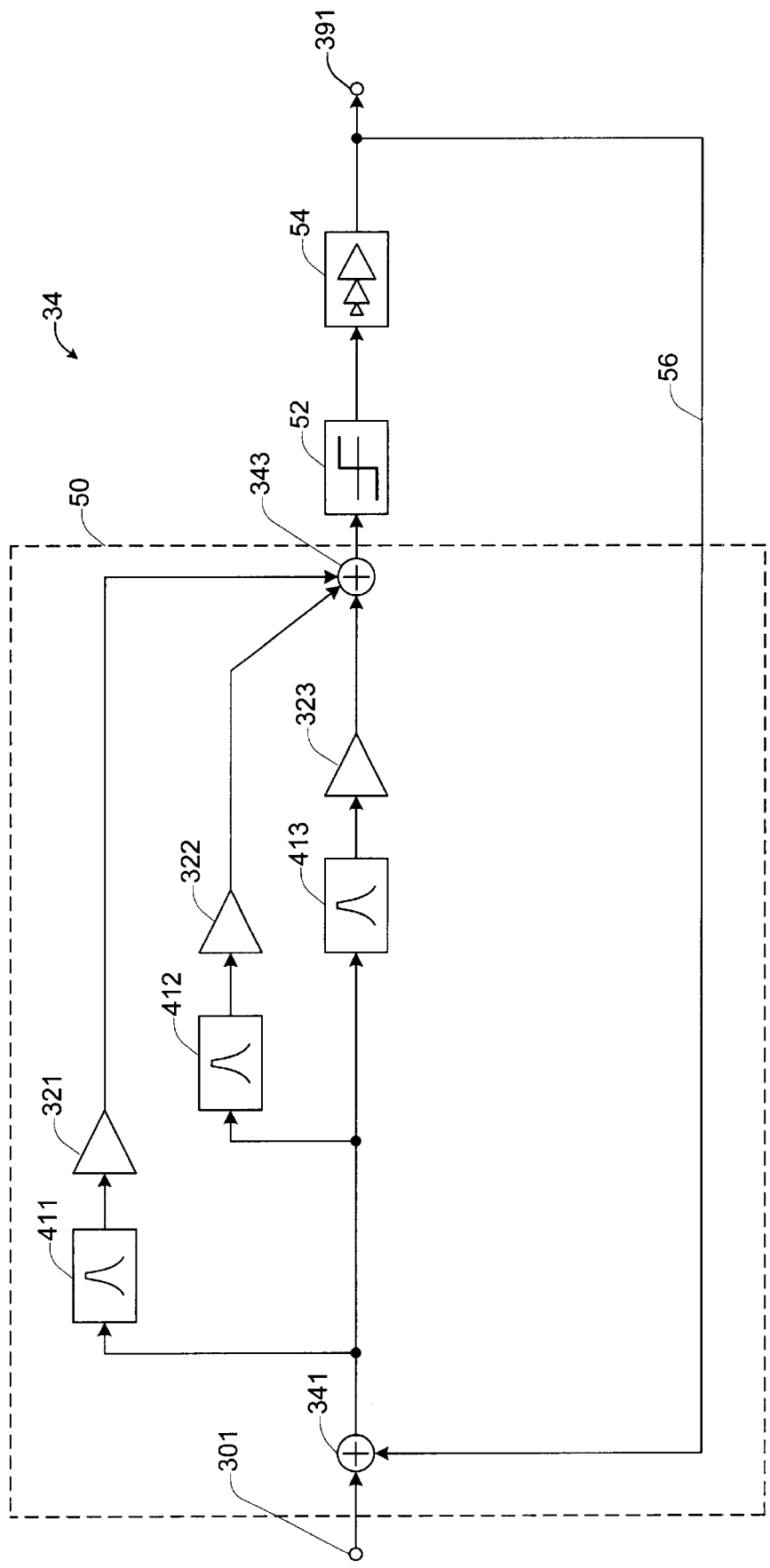
FIG. 4 is a block diagram of the amplifier of FIG. 2 with an expanded view in accordance with a second embodiment of the present invention.

FIG. 4 illustrates another power amplifier 34 used for another embodiment of the present invention. The frequency selective network 50 shown in FIG. 4 includes bandpass resonators 411–413, which are equivalent to the resonator 311, the resonators 311 and 312 coupled in series, and the resonators 311–313 coupled in series, respectively. In other words, the resonators 411–413 are a first-order filter, a second-order filter and a third-order filter, respectively. The first-order, second-order and third-order filters generate a first-order filtered signal, a second-order filtered signal and a third-order filtered signal, respectively. The frequency selective network 50 of FIG. 4 functions similar to that of FIG. 3 with the exception that the resonators 411–413 are coupled in parallel, while the resonators 311–313 are coupled in series.

Figure 5:
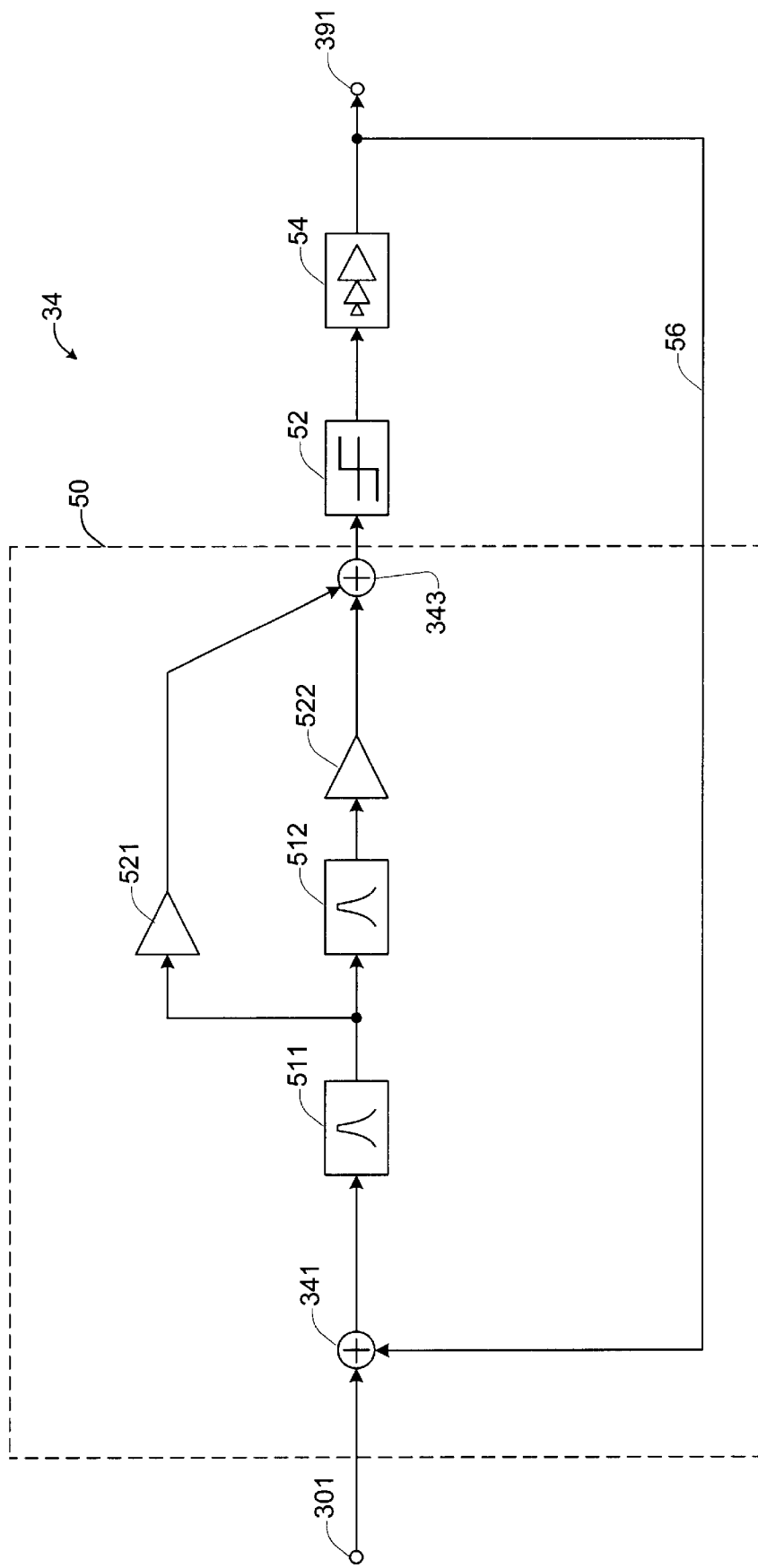
FIG. 5 is a block diagram of the amplifier of FIG. 2 with an expanded view in accordance with a third embodiment of the present invention.

FIG. 5 illustrates still another power amplifier 34 used for another embodiment of the present invention. The frequency selective network 50 shown in FIG. 5 includes bandpass resonators 511 and 512. Multipliers 521 and 522 receive signals output from the resonators 511 and 512, respectively. The multipliers 521 and 522 have coefficients k1 and k2 respectively.

The coefficients k1 and k2 of the multipliers 521 and 522 are adaptively set to values based on normalized power output Pn, where Pn=P–Pmax (P: power output, Pmax: maximum power output) as follows:

TABLE 4

| Pn(dB)     | k1  | k2  |
|------------|-----|-----|
| 0 to –20   | 4.0 | 0.5 |
| –20 to –40 | 4.0 | 2.0 |

However, it should be understood that Table 4 above shows a possible specific set of coefficients k1 and k2 used for the embodiment of the present invention, and may be modified based on specific requirements for the power amplifier 34. Suppose the coefficients k1 and k2 are generally expressed as follows:

TABLE 5

| Pn (dB) | k1  | k2  |
|---------|-----|-----|
| Range 1 | k11 | k21 |
| Range 2 | k12 | k22 |

(Range 1 > Range 2)

For example, the coefficients k1 and k2 may be values satisfying the following expressions:

$$k22/k12 > k21/k11 \quad (3).$$

The expression 3 means that the first-order filter (i.e., the resonator 511) is relatively dominant in the high output level (i.e., Range 1), and the second-order filter (i.e., the resonators 511 and 512 coupled in series) is relatively dominant in the high output level (i.e., Range 2).

Figure 6:
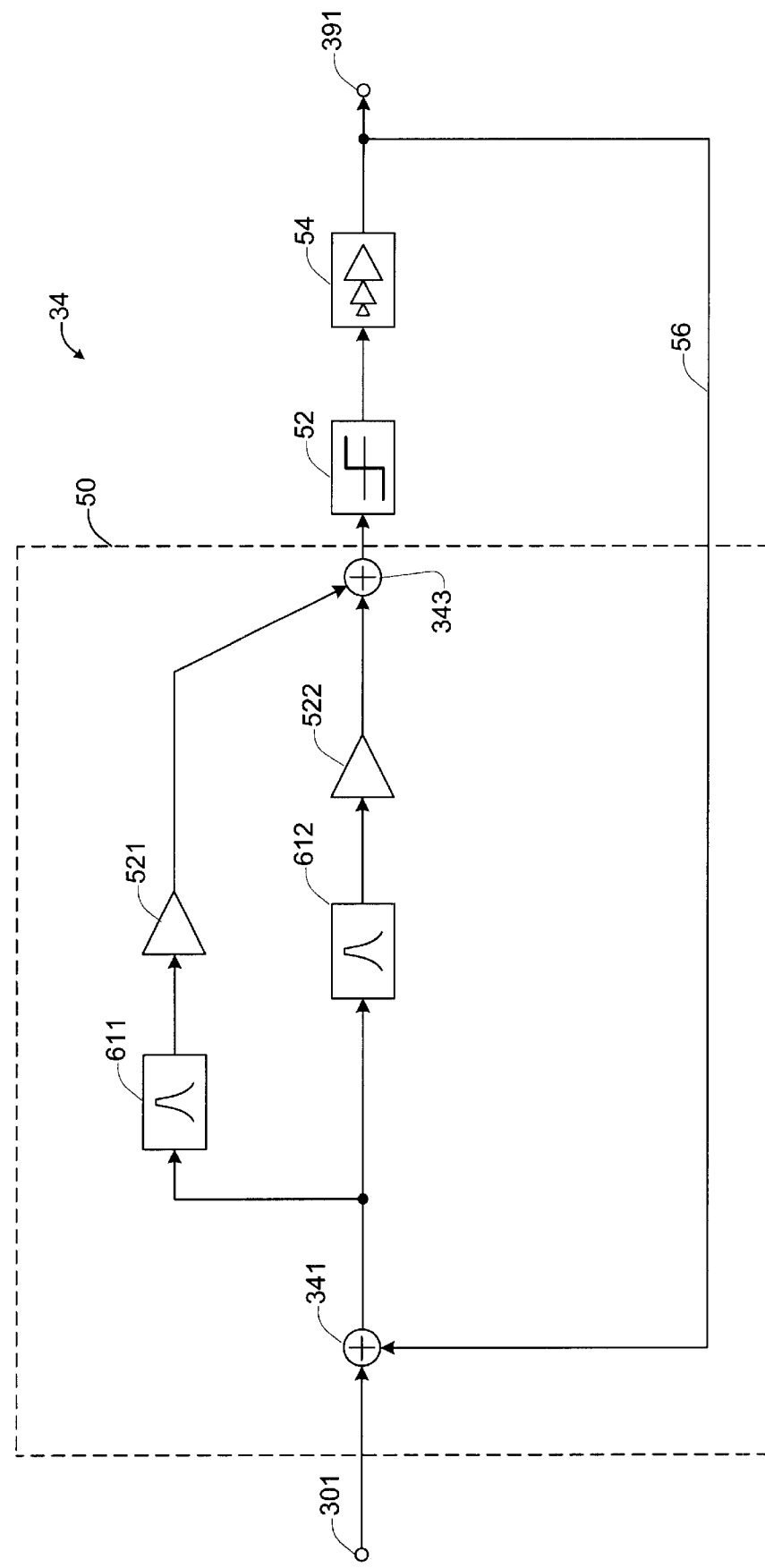
FIG. 6 is a block diagram of the amplifier of FIG. 2 with an expanded view in accordance with a fourth embodiment of the present invention.

FIG. 6 illustrates another power amplifier 34 used for another embodiment of the present invention. The frequency selective network 50 shown in FIG. 6 includes bandpass resonators 611 and 612, which are equivalent to the resonator 511, and the resonators 511 and 512 coupled in series, respectively. In other words, the resonators 611 and 612 are a first-order filter and a second-order filter, respectively. The first-order and second-order filters generate a first-order filtered signal and a second-order filtered signal, respectively. The frequency selective network 50 of FIG. 6 functions similar to that of FIG. 5 with the exception that the resonators 611 and 612 are coupled in parallel, while the resonators 511 and 512 are coupled in series.

As understood by those skilled in the art, the specific values of k1, k2 and k3 are not limited to the examples described above. The embodiments of the present invention dynamically adjust the coefficients k1, k2 and k3 (or k1 and k2 for FIGS. 5 and 6) depending on the normalized power output Pn. Such a scheme is advantageous where low noise floor is desirable for power back off in the relatively low output range, while stable feedback is necessary without saturation in the relatively high output range.

The output level needed for the adjustment of the coefficients k1, k2 and k3 is determined by the input level, which in turn is determined in various ways including by AGC (Auto Gain Control) circuitry or directly from input control bits. The order of the resonators can also be adjusted by various technique including adjusting one or more of the bypass gains, intermediate stage feedback gains, and/or resonator stage gains. The order of the resonators can also be adjusted by simply switching the corresponding stages in or out.

Figure 7A:
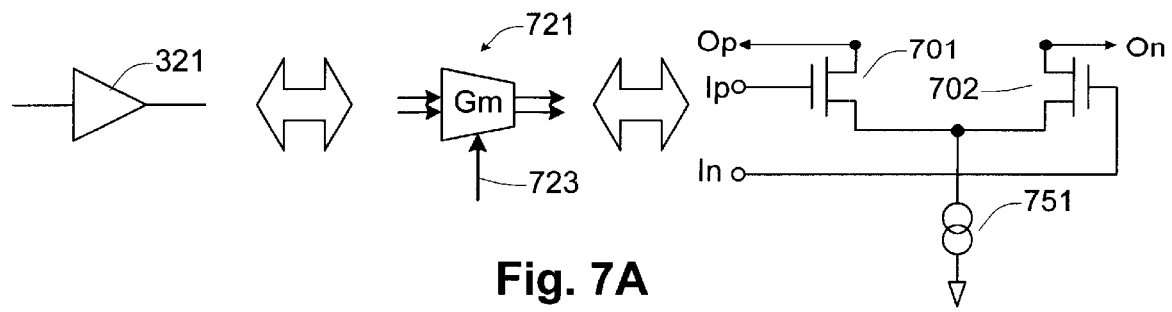
FIGS. 7A and 7B are diagrams of specific examples of the multipliers used for the specific embodiments of the present invention.
Figure 7B:
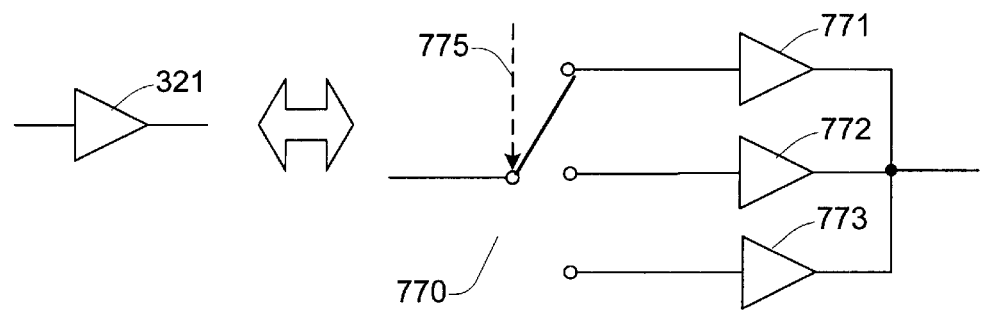

FIGS. 7A and 7B show specific examples of the multipliers 321–323, 521 and 522 (collectively referred to as 321) used for the above-described specific embodiments of the present invention. As shown in FIG. 7A, in one specific embodiment, the multiplier 321 is implemented by a transconductive element 721 having a control node 723 for adjusting the gain of the element 721. The transconductive element 721 is driven differentially (i.e., balanced) for improved noise immunity. The transconductance element 721 is further broken down into equivalent components including a pair of FETs 701 and 702 with a current source 751. Nodes Ip, In, Op and On represent a positive input, a negative input, a positive output and a negative output, respectively. The coefficients k1, k2 and k3 of the multiplier 321 are adjusted by applying a control voltage to the control node 723.

As shown in FIG. 7B, in another specific embodiment, the multiplier 321 is implemented by a switch 770, multipliers 771–773 and a control node 775. The multipliers 771–773 have, for example, the coefficients k1, k2 and k3, respectively. The switch 770 causes one of the multipliers 771–773 to selectively receive the input signal of the multiplier 321 based on a control signal applied to the control node 775.

Figure 8:
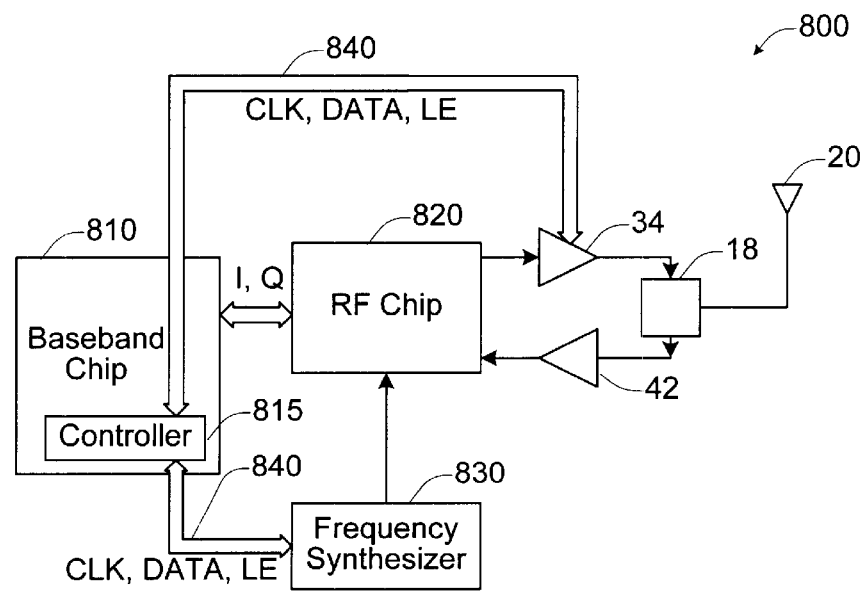
FIG. 8 is a block diagram of a specific embodiment of the communication system according to the present invention.

FIG. 8 illustrates a specific embodiment of the communication system 800 according to the present invention. The system 800 includes a baseband chip 810, an RF chip 820, and a frequency synthesizer 830 in addition to the power amplifier 34, the LNA 42, the duplexor 18, and the antenna 20 described referring to FIGS. 1 and 2. A controller 815 is provided in the baseband chip 810 in order to adjust the coefficients k1–k3 of the multiplier 321. The controller 815 and the amplifier 34 are coupled by a serial data bus 840, and the controller 815 and the frequency synthesizer 830 are also coupled by the serial data bus 840. The serial data bus may be an I²C bus, but is not limited to this specific bus. The functionality of the controller 815 is implemented by any combination of hardware and/or software.

In one specific embodiment of the communication system 800, the controller 815 receives from the baseband chip 810 information representing the input level of the power amplifier 34, which in turn is determined by AGC (Auto Gain Control) circuitry. However, it will be understood that the signal level information corresponding to the normalized power output Pn on which the controller 815 determines values of the coefficients k1–k3 based may be retrieved from various parts of the system including an RF chip 820.

Figure 9:
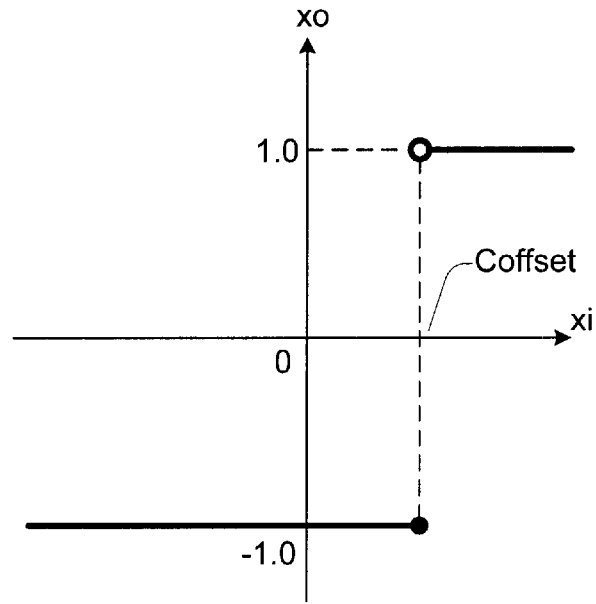
FIGS. 9 and 10 are plots of characteristics of the A/D converter used for embodiments according to the present invention.
Figure 10:
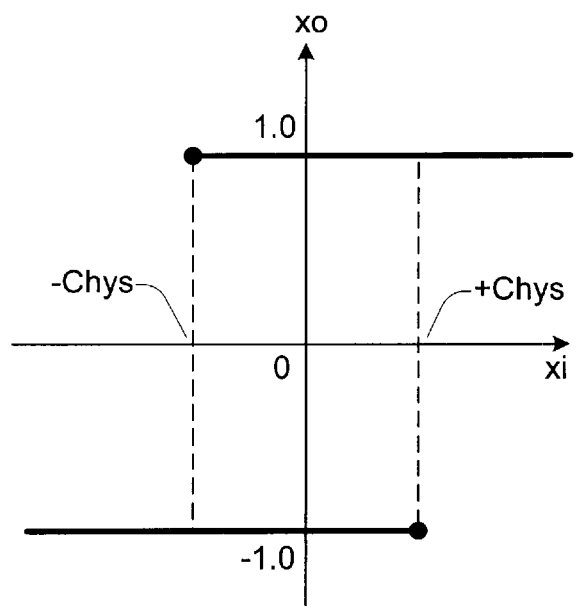

FIGS. 9 and 10 illustrates plots of characteristics of the A/D converter (or quantizer) 52 used for embodiments according to the present invention. In the A/D converter 52 described below in detail referring to FIGS. 9 and 10, the quantized signal does not fluctuate between the two values of the output signal when the input signal is substantially stable. The horizontal axis represents an input signal xi of the A/D converter 52, and the vertical axis represents an output signal xo of the A/D converter 52. In this specification, the input signal xi and the output signal xo are normalized by a maximum (or peak) input level and a maximum (or peak) output level of the A/D converter 52, respectively. An offset value and a hysteresis value described in detail later are also normalized by the maximum input level.

In a specific embodiment shown in FIG. 9, the A/D converter 52 has an input offset Coffset, which is a significant fraction of the A/D converter 52's normalized output levels. For example, the input signal xi and the output signal xo have the following relationship:

$$xo=-1.0 \text{ for } xi<=\text{Coffset},$$

and $$xo=1.0 \text{ for } xi>\text{Coffset},$$

where the input offset Coffset=0.7, and xi and xo are normalized by a peak of the input signal and a peak of the output signal, respectively.

In another specific embodiment of the A/D converter 52, the input offset Coffset may range from about 0.5 to about 0.90. For example, the input signal xi and the output signal xo may have the following relationship:

$$xo=-1.0 \text{ for } xi<=\text{Coffset},$$

and $$xo=1.0 \text{ for } xi>\text{Coffset},$$

where the input offset 0.5<=Coffset<=0.90, and xi and xo are normalized by a peak of the input signal and a peak of the output signal, respectively.

In another specific embodiment shown in FIG. 10, the A/D converter 52 has hysteresis or memory. Specifically, when the input signal xi is between −Chys and +Chys, the A/D converter 52 maintains a previous value. In this specification, this value Chys (>0) is referred to as a "hysteresis value." Otherwise, the A/D converter 52 outputs +1.0 if the input signal xi is larger than +Chys, and outputs −1.0 if the input signal xi is smaller than −Chys. For example, the input signal xi and the output signal xo have the following relationship:

$$xo=\text{previous state of } xo \text{ for } -Chys<=xi<=+Chys,$$

$$xo=1.0 \text{ for } xi>+Chys,$$

and $$xo=-1.0 \text{ for } xi<-Chys,$$

where the hysteresis value Chys=0.7, and xi and xo are normalized by a peak of the input signal and a peak of the output signal, respectively.

In another specific embodiment of the A/D converter 52, the hysteresis Chys may range from about 0.5 to about 0.9. Thus, the input signal xi and the output signal xo may have the following relationship:

$$xo=\text{previous state of } xo \text{ for } -Chys<=xi<=+Chys,$$

$$xo=1.0 \text{ for } xi>+Chys,$$

and $$xo=-1.0 \text{ for } xi<-Chys,$$

where the hysteresis value Chys satisfies 0.5<Chys<0.9, and xi and xo are normalized by a peak of the input signal and a peak of the output signal, respectively.

It should be understood that the functionality of the A/D converter 52 described referring to FIGS. 9 and 10 may be implemented by hardware, software or combination of both. For example, the A/D converter 52 is implemented by various analog/digital circuitry, including a hybrid IC (Integrated Circuit) and a DSP (Digital Signal Processor).

It should be understood that the controller 815 may take various forms. It may include one or more general purpose microprocessors that are selectively configured or reconfigured to implement the functions described herein. Or, it may include one or more specially designed processors or microcontrollers that contain logic and/or circuitry for implementing the functions described herein. Any of the logical devices serving as the controller 815 may be designed as general purpose microprocessors, microcontrollers, application specific integrated circuits (ASICs), digital signal processors (DSPs), programmable logic devices (PLDs), field programmable gate arrays (FPGAs), and the like. They may execute instructions under the control of the hardware, firmware, software, reconfigurable hardware, combinations of these, etc. The hardware elements described above may be configured (usually temporarily) to act as one or more software modules for performing the operations of the present invention. All or any part of the bandpass amplifier and the communication system according to the present invention described above may be manufactured on a semiconductor chip, or may be manufactured as a hybrid integrated circuit.

While the present invention has been described in relation to a cell phone application, it should be readily apparent that the invention may be practiced in a wide variety of contexts and alternative embodiments. For example, the RF amplifier of the present invention could be used in a cell base station or any other application requiring an efficient RF amplifier. The bandpass amplifier of the present invention may be incorporated into a communication system. The digital amplifier of the present invention may also be used for RF transmissions at frequencies such as 1.8 GHz or 3.0 GHz or higher. In such embodiments, higher transmission rates can be achieved by increasing the sampling rate (fs) based on the ratios described above. Transistors T1 and T2 can also be a number of different types of devices including MESFETs, HBTs, CMOS, or NMOS and can be fabricated from a number of different processes and materials, including GaAs, SiGe, or standard silicon. It will therefore be understood that the embodiments provided herein are merely exemplary, and that the true scope and spirit of the invention should be determined by the claims.

What is claimed is:

1. A device for amplifying an input signal, thereby generating an output signal, comprising:

a filter which filters the input signal, thereby generating a filtered signal;

a quantizer which quantizes the filtered signal into one of two values, thereby generating a quantized signal;

a driver which amplifies the quantized signal, thereby generating the output signal; and a feedback loop which feeds the output signal to the filter;

wherein the quantizer has characteristics in which the quantized signal does not fluctuate between the two values when the input signal is substantially stable.

2. The device of claim 1, wherein the quantizer has an input offset.

3. The device of claim 2, wherein the input offset normalized by a peak of the filtered signal ranges from about 0.5 to about 0.9, and from about −0.9 to about −0.5.

4. The device of claim 1, wherein the quantizer has a hysteresis value.

5. The device of claim 4, wherein the hysteresis value normalized by a peak of the filtered signal ranges from about 0.5 to about 0.9.

6. A device for amplifying an input signal, thereby generating an output signal, comprising:

a means for filtering the input signal, thereby generating a filtered signal;

a means for quantizing the filtered signal into one of two values, thereby generating a quantized signal;

a means for amplifying the quantized signal, thereby generating the output signal; and a means for feeding the output signal to the filter, wherein the quantizer has characteristics in which the quantized signal does not fluctuate between the two values when the input signal is substantially stable.

7. The device of claim 6, wherein the means for quantizing has an input offset.

8. The device of claim 7, wherein the input offset normalized by a peak of the filtered signal ranges from about 0.5 to about 0.9, and from about −0.9 to about −0.5.

9. The device of claim 6, wherein the means for quantizing has a hysteresis characteristic.

10. The device of claim 9, wherein the hysteresis value normalized by a peak of the filtered signal ranges from about 0.5 to about 0.9.

11. A method for amplifying an input signal, thereby generating an output signal, comprising:

filtering the input signal, thereby generating a filtered signal;

quantizing the filtered signal into one of two values, thereby generating a quantized signal;

amplifying the quantized signal, thereby generating the output signal; and feeding the output signal to the filter, wherein the quantized signal does not fluctuate between the two values when the input signal is substantially stable.

12. The method of claim 11, wherein the quantizing comprises providing an input offset.

13. The method of claim 12, wherein the input offset normalized by a peak of the filtered signal ranges from about 0.5 to about 0.9, and from about −0.9 to about −0.5.

14. The method of claim 11, wherein the quantizing comprises providing a hysteresis characteristic.

15. The method of claim 14, wherein the hysteresis value normalized by a peak of the filtered signal ranges from about 0.5 to about 0.9.

* * * * *